(12) United States Patent
Park et al.

(10) Patent No.: US 7,518,873 B2
(45) Date of Patent: Apr. 14, 2009

(54) HEAT SPREADER, SEMICONDUCTOR PACKAGE MODULE AND MEMORY MODULE HAVING THE HEAT SPREADER

(75) Inventors: Chang-Yong Park, Cheonan-si (KR); Hyun-Jong Oh, Cheonan-si (KR); Yong-Hyun Kim, Suwon-si (KR); Dong-Woo Shin, Cheonan-si (KR); Kyung-Du Kim, Daejeon (KR); Dong-Chun Lee, Cheonan-si (KR); Kwang-Ho Chun, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 4 days.

(21) Appl. No.: 11/481,179

(22) Filed: Jul. 6, 2006

(65) Prior Publication Data

US 2007/0008703 A1 Jan. 11, 2007

(30) Foreign Application Priority Data

Jul. 7, 2005 (KR) .................... 10-2005-0061309

(51) Int. Cl.
*H05K 7/20* (2006.01)
*H01L 23/34* (2006.01)
*F28F 7/00* (2006.01)

(52) U.S. Cl. .................. 361/710; 361/704; 361/711; 257/718; 165/185

(58) Field of Classification Search .............. 361/697, 361/704, 709–711, 715, 719; 165/80.3, 104.33, 165/185; 257/718–719; 24/297, 453, 457–458, 24/625; 248/505, 510
See application file for complete search history.

(56) References Cited

U.S. PATENT DOCUMENTS

| 4,575,038 | A  | * | 3/1986  | Moore .......................... 248/505 |
| 5,241,453 | A  | * | 8/1993  | Bright et al. ................. 361/704 |
| 6,061,239 | A  | * | 5/2000  | Blomquist ................... 361/704 |
| 6,381,813 | B1 | * | 5/2002  | Lai .............................. 24/456 |
| 6,496,374 | B1 | * | 12/2002 | Caldwell ..................... 361/709 |
| 6,644,396 | B2 | * | 11/2003 | Liang .......................... 165/185 |
| 6,749,448 | B2 | * | 6/2004  | Bright et al. ................. 439/160 |

(Continued)

FOREIGN PATENT DOCUMENTS

DE 3516489 A * 11/1986

(Continued)

*Primary Examiner*—Jayprakash N Gandhi
*Assistant Examiner*—Bradley H Thomas
(74) *Attorney, Agent, or Firm*—Harness, Dickey & Pierce

(57) ABSTRACT

A heat spreader includes a heat sinking plate and a pressure clip. The heat sinking plate radiates the heat away from a heat source. The pressure clip fixes the heat sinking plate to the heat source. The pressure clip includes a spine (pressing part), one or more ribs and hook parts. The spine is arranged on the heat sinking plate. The one or more ribs extend from the spine and contact the heat source. The hook parts extend from the spine and are supported by the heat source. The pressure clip further includes mounting parts that couple the spine to the hook parts. A bending space is formed between the spine and the heat sinking plate. The heat spreader may be attached to a printed circuit board (PCB) with, e.g., a one-touch method, so that assembling processes of the memory module may be automated.

37 Claims, 18 Drawing Sheets

U.S. PATENT DOCUMENTS

| | | |
|---|---|---|
| 6,765,797 B2 | 7/2004 | Summers et al. |
| 6,816,376 B2 * | 11/2004 | Bright et al. ................. 361/704 |
| 6,913,070 B2 * | 7/2005 | Wang et al. ................. 165/80.3 |
| 6,980,437 B2 * | 12/2005 | Bright ........................ 361/704 |
| 2007/0103874 A1 * | 5/2007 | Chang ........................ 361/719 |
| 2007/0165380 A1 * | 7/2007 | Lai et al. .................... 361/697 |
| 2007/0236886 A1 * | 10/2007 | Yang et al. .................. 361/700 |

FOREIGN PATENT DOCUMENTS

| | | |
|---|---|---|
| JP | 11-354701 | 12/1999 |
| KR | 10-2003-0043172 | 6/2003 |
| KR | 20-361451 | 8/2004 |

* cited by examiner

HEAT SPREADER, SEMICONDUCTOR PACKAGE MODULE AND MEMORY MODULE HAVING THE HEAT SPREADER

PRIORITY STATEMENT

This application claims priority of Korean Patent Application No. 2005-61309 filed on Jul. 7, 2005 in the Korean Intellectual Property Office (KIPO), the entire contents of which are hereby incorporated by reference.

BACKGROUND

1. Field of the Invention

The present invention relates to a heat spreader, a semiconductor package module and a memory module having the heat spreader.

2. Description of the Related Art

According as central processing unit (CPU) speeds have increased, all efforts have been continuously made so as to increase data input/output (I/O) speeds and degrees of integration of main memory, thereby improving the performance of systems including CPUs.

In order to increase the data I/O speeds of the main memory, a bus structure capable of transmitting/receiving packets at high speed has been used between the CPU and the memory. In addition, in order to increase memory capacities of the main memory, memory module has been used. Memory module includes a printed circuit board (PCB) on which a plurality of memory chips is mounted.

A memory module may be classified into a single in-line memory module (SIMM) and a dual in-line memory module (DIMM). The SIMM includes a plurality of semiconductor packages (i.e., memory chips) mounted on only one side of the PCB, and the DIMM has a plurality of the semiconductor packages mounted on both sides of the PCB.

The memory capacities of the main memory may be increased with the use of the memory modules.

Furthermore, a data transmission speed may be increased by using a high clock frequency of the memory in order to provide the advanced data I/O speed of the memory. Additionally, in order to increase the memory capacity, more memory chips may be mounted on the memory module, or the number of slots of a motherboard may be increased so that many memory modules may be mounted on the motherboard.

However, when the clock frequency of the memory is increased, a timing margin of the memory is decreased, and when the number of slots is increased, the transmission of a signal is weakened due to a heavy load on the transmission line. One of a DIMM capable of compensating for the load is referred to as a registered DIMM.

The registered DIMM includes a phase-locked loop (PLL), a register and a plurality of memory chips. The registered DIMM is mounted on the motherboard so as to compensate for the load. However, in case that there are many slots or a high clock frequency, transmission efficiency is decreased due to reflected waves on the transmission line.

In order to improve transmission efficiency, a fully buffered DIMM (FBDIMM) has been provided. The FBDIMM has a hub, such as an advanced memory buffer (AMB) logic chip that is mounted on the center of the memory module.

The AMB receives packet signals including a memory command and/or data from an external host (e.g., a memory controller), and provides the received data to respective memory chips. In addition, the AMB packetizes data outputted from the memory chips, and provide the packets to the memory controller. In the FBDIMM, signals from external sources are transmitted to the respective memory chips via the AMB. Accordingly, all signal lines on which the signals are transmitted are coupled to the AMB. Consequently, a large load is concentrated on the AMB and high heat may be generated in the AMB.

High heat reduces the life span of the AMB (according to the Related Art) and lowers the operational reliability of peripheral circuits of the AMB. Hence, it is advantageous to quickly dissipate away the heat from the AMB.

A conventional FBDIMM includes a heat spreader for radiating the heat of the AMB.

FIG. 1 is a top plan view illustrating an FBDIMM having a conventional heat spreader.

Referring to FIG. 1, an FBDIMM 10 includes a PCB 1, a plurality of semiconductor packages 2 that are mounted on both sides of the PCB 1, an AMB (not shown) that is mounted on one side of the PCB 1, and a heat spreader 3 covering the AMB. The conventional heat spreader 3 has a shape of a thin plate and is fixed on the AMB to form an integral structure.

However, the conventional heat spreader 3 has thermal characteristics that are not sufficient to spread the heat radiated from the AMB.

Furthermore, a process for attaching the heat spreader to the memory module needs is not simple and is not well suited to an automated process for attaching the heat spreader.

SUMMARY

Accordingly, one or more embodiments of the present invention are provided to substantially obviate one or more problems due to limitations and disadvantages of the related art.

One or more embodiments of the present invention provide a heat spreader that has an enhanced heat radiation effect and may be attached to a heat source with a one-touch method.

One or more embodiments of the present invention also provide a semiconductor package module having the heat spreader.

One or more embodiments of the present invention also provide a memory module having the heat spreader.

One or more embodiments of the present invention provide a heat spreader that includes a heat sinking plate configured to radiate heat away from a heat source; and a pressure clip configured to fix the heat sinking plate to a heat source. Such a pressure clip can include a spine, one or more ribs and hook parts. The spine is arranged on the heat sinking plate. The one or more ribs extend from the spine and contact the heat source. The hook parts extend from the spine to engage the heat source. The pressure clip further includes mounting parts that couple the spine to the hook parts. A bending space is formed between the spine and the heat sinking plate. Such a heat spreader may be attached to a printed circuit board (PCB), e.g., with a one-touch method, so that assembling processes of the memory module may be automated.

Additional features and advantages of the present invention will be more fully apparent from the following detailed description of example embodiments, the accompanying drawings and the associated claims.

BRIEF DESCRIPTION OF THE DRAWINGS

The accompanying drawings are intended to depict example embodiments of the present invention and should not be interpreted to limit the scope thereof. The accompanying drawings are not to be considered as drawn to scale unless explicitly noted.

DETAILED DESCRIPTION OF EXAMPLE EMBODIMENTS

Figure 1:
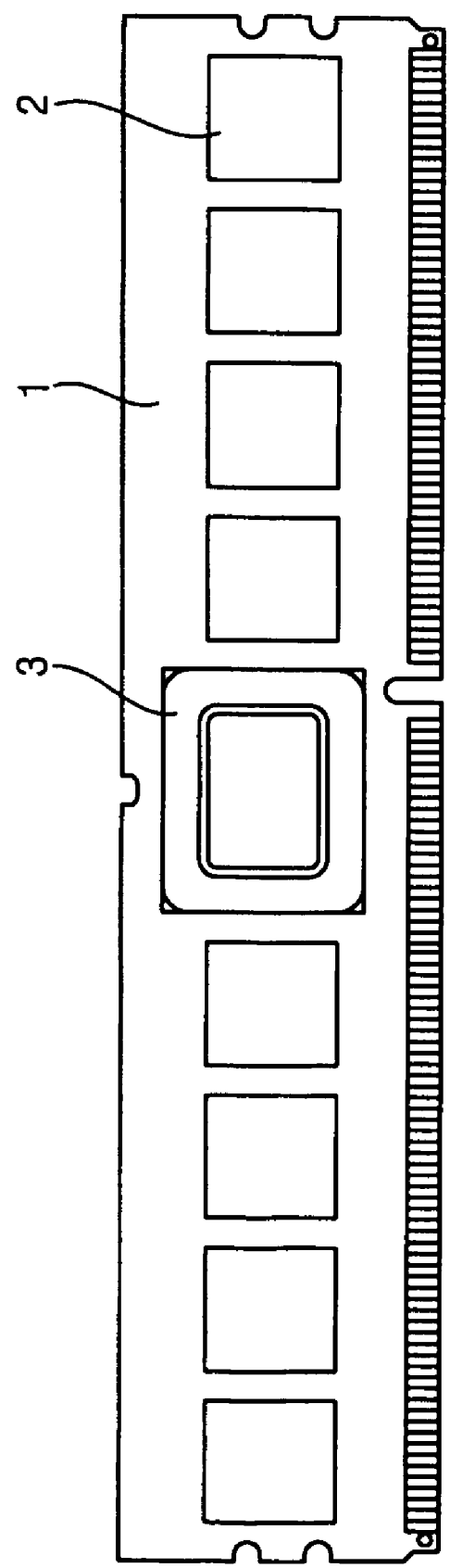
FIG. 1 is a top plan view illustrating a conventional fully buffered dual in-line memory module (FBDIMM) having a conventional heat spreader.

Example embodiments of the present invention are disclosed herein. However, specific structural and functional details disclosed herein are merely representative for purposes of describing example embodiments of the present invention. This invention may, however, be embodied in many alternate forms and should not be construed as limited to example embodiments of the present invention set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Heat Spreader

Figure 2:
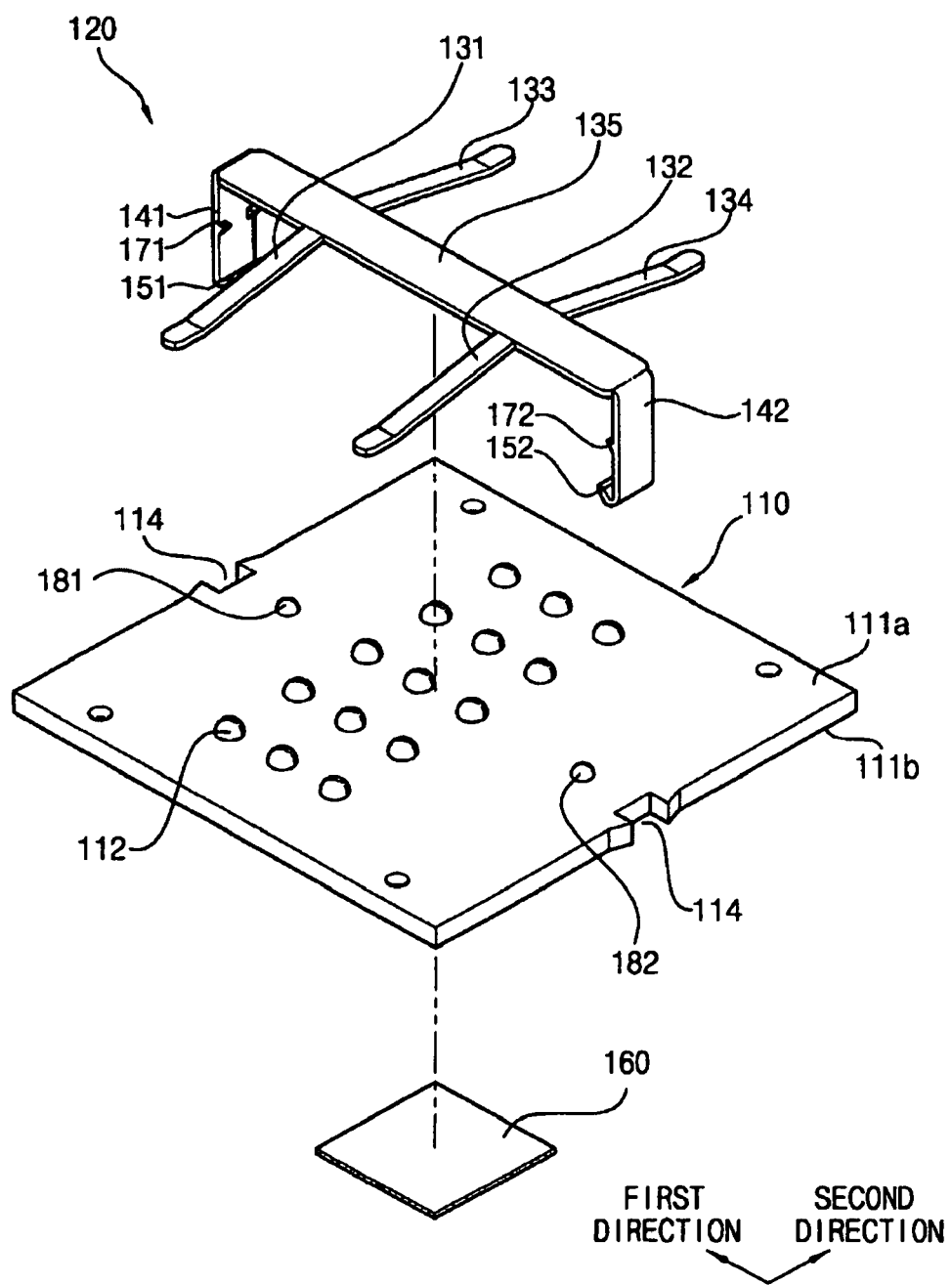
FIG. 2 is an exploded perspective view illustrating a heat spreader according to an example embodiment of the present invention.
Figure 3:
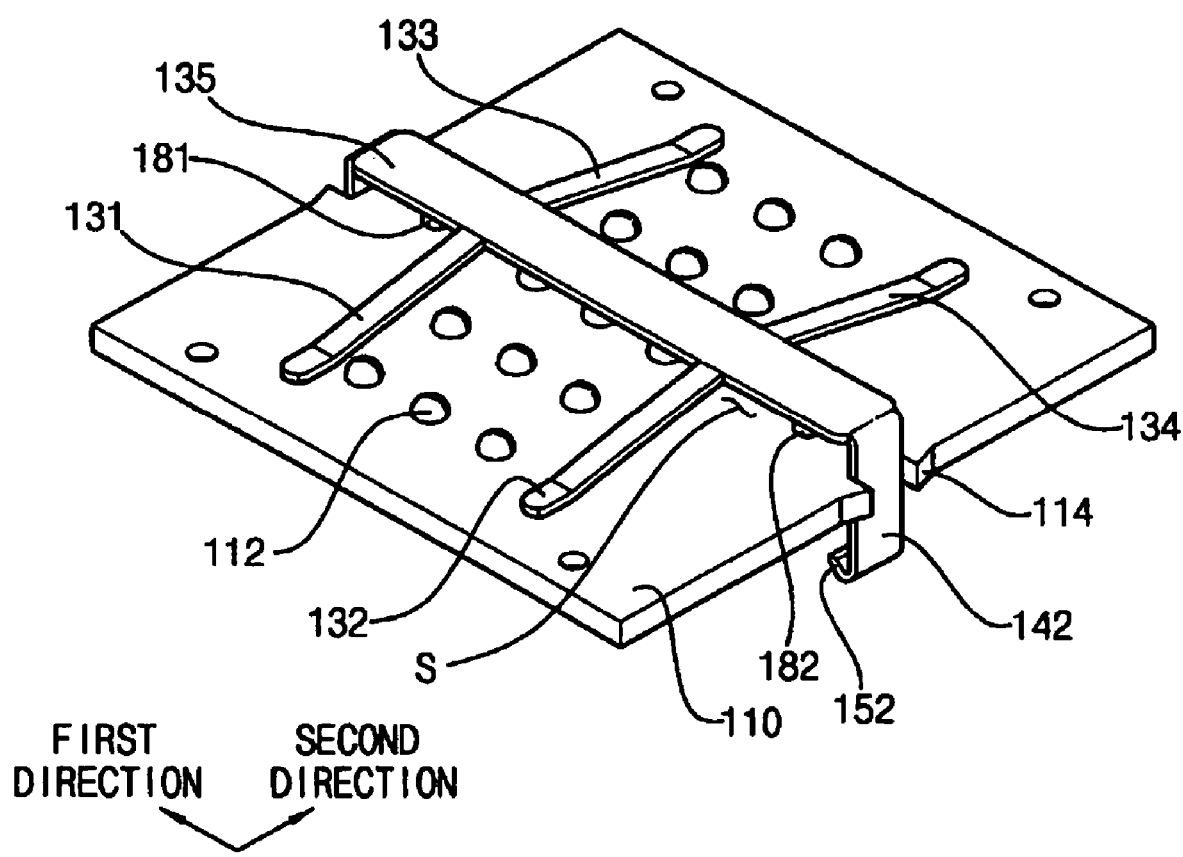
FIG. 3 is an unexploded perspective view illustrating the heat spreader of FIG. 2.
Figure 4:
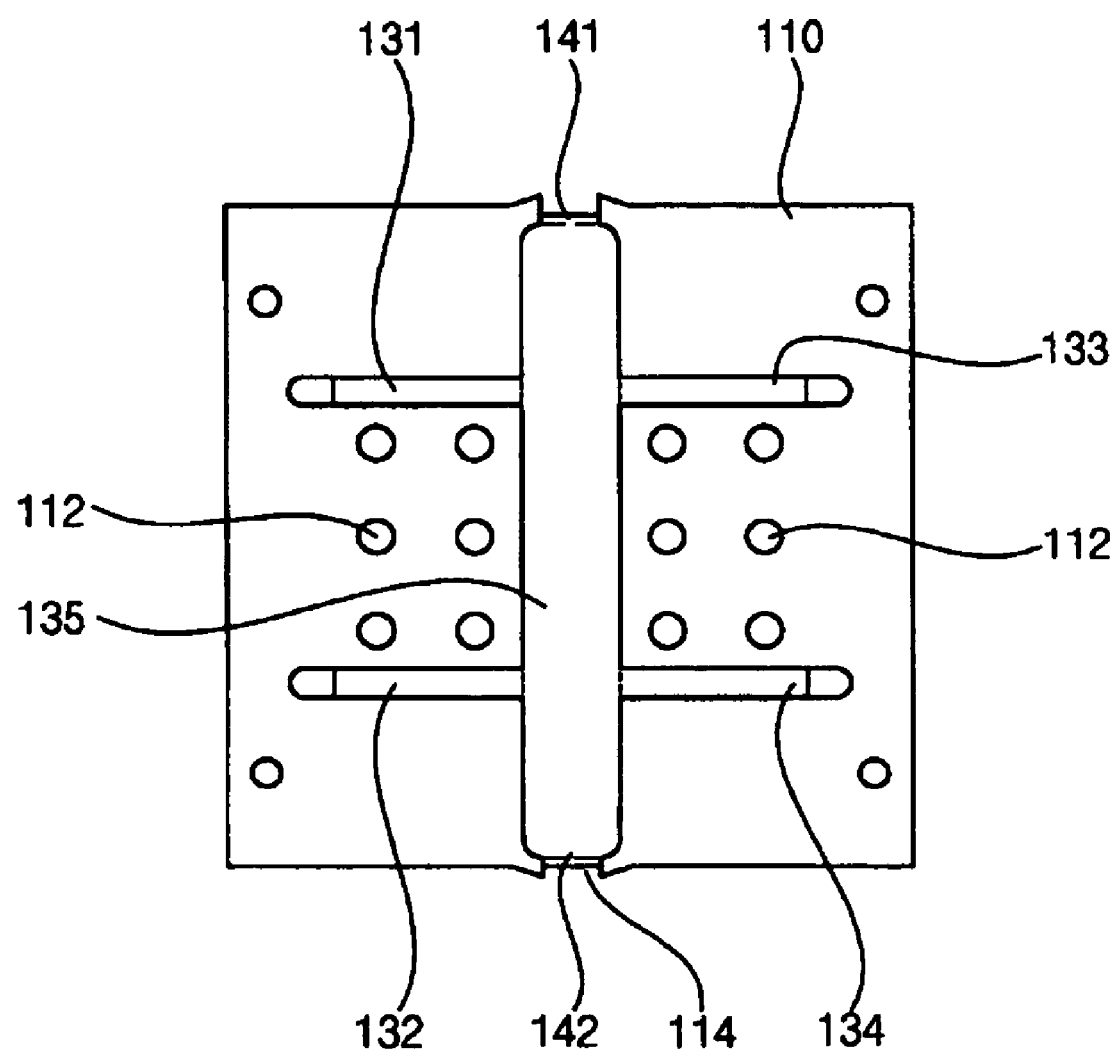
FIG. 4 is a top plan view illustrating the heat spreader shown in FIG. 3.
Figure 5:
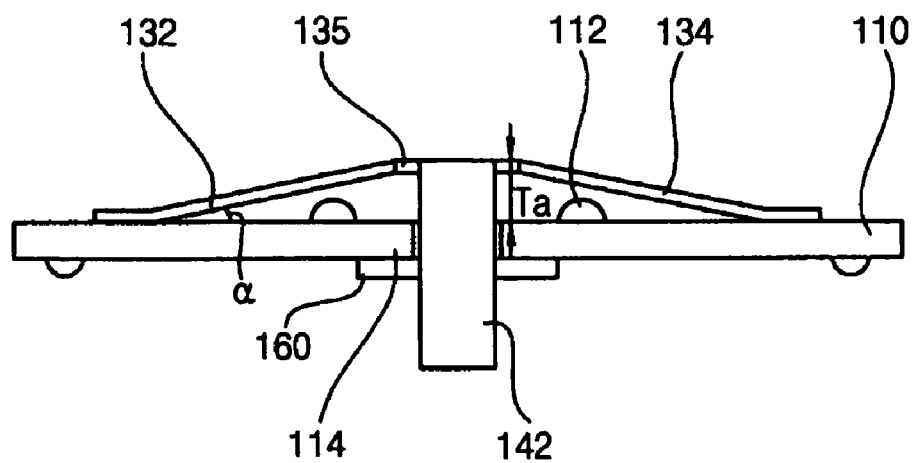
FIG. 5 is a front view illustrating the heat spreader shown in FIG. 3.
Figure 6:
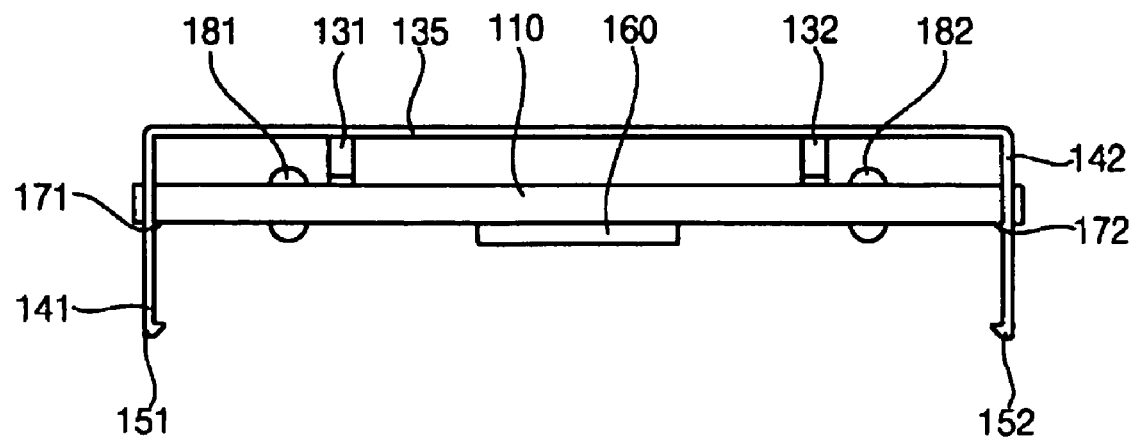
FIG. 6 is a side view illustrating the heat spreader shown in FIG. 3.

FIG. 2 is an exploded perspective view illustrating a heat spreader 100 according to an example embodiment of the present invention. FIG. 3 is an unexploded perspective view illustrating the heat spreader 100 of FIG. 2. FIG. 4 is a top plan view illustrating the heat spreader 100 shown in FIG. 3. FIG. 5 is a front view illustrating the heat spreader 100 shown in FIG. 3. Additionally, FIG. 6 is a side view of the heat spreader shown in FIG. 3.

Referring to FIG. 2, a heat spreader 100 may include a heat sinking plate 110 that contacts a heat source (not shown) and a pressure clip 120 for fixing the heat sinking plate 110 to the heat source. The heat source may be, for example, a general semiconductor package, an advanced memory buffer (AMB)

package of a fully buffered dual in-line memory module (FBDIMM) (see FIG. 16), a printed circuit board (PCB) of the FBDIMM on which the AMB package is mounted, etc.

The heat sinking plate 110 has a shape of a thin plate having a first surface 111a and a second surface 111b. The second surface 111b contacts the heat source on the opposite side of the first surface. The heat sinking plate 110 can be located next to an upper part of the heat source, in general, wherein the first surface 111a is the upper surface of the heat sinking plate and the second surface 111b is the lower surface of the heat sinking plate.

The heat sinking plate 110 receives the heat and radiates the heat away from the heat source. Accordingly, the heat sinking plate 110 may be made of a material having excellent thermal conductivity, for example, copper. Further, in order to expand an area of heat radiation of the heat sinking plate 110, convex parts 112 may be formed on the first surface 111a of the heat sinking plate 110. The convex parts 112 may have concavo-convex shapes. The concavo-convex shapes of the convex parts may vary so as to expand the area of heat radiation.

Two locking grooves 114 are formed on both sides of the heat sinking plate 110, where an imaginary reference line extending between them would be parallel to a first direction. The functions of the locking grooves 114 will be described hereinafter.

First and second supporting protrusions 181 and 182 may be formed on the first surface 111a of the heat sinking plate 110. The functions of the first and the second supporting protrusions 181, 182 will be described hereinafter.

The pressure clip 120 may include a spine (or pressing part) 135 disposed over the first surface 111a of the heat sinking plate 110, first to fourth ribs (or ribs) 131, 132, 133 and 134 that extend (respectively) from one or the other side of the spine 135 and contact the first surface 111a. of the heat sinking plate 110, first and second mounting parts 141 and 142 that extend toward the heat source from both ends of the spine 135 in a lower direction, and first and second hook parts 151 and 152 which are respectively formed on respective lower ends of the first and the second mounting parts 141 and 142. For example, the pressure clip 120 may be made of an elastically deformable or flexible or resilient material, for example, copper, so as to be capable of exerting a biasing force against the heat sinking plate 110 when the ribs 131-134 are compressed against the heating sinking plate 110.

Alternatively, other numbers of ribs are contemplated. Further in the alternative, central sections of the ribs may be curved instead of substantially straight as shown in FIG. 2.

Referring to FIG. 3, the spine 135 is spaced apart from the first surface 111a of the heat sinking plate 110 and extends along the first direction. In other words, a bending space S (or gap to accommodate deflection of the spine 135 towards the heat sinking plate 110) is formed between the spine 135 and the first surface 111a of the heat sinking plate 110.

The first and second supporting protrusions 181 and 182 are spaced apart from each other along a length direction of the spine 135 in the bending space S. Specifically, the first and the second supporting protrusions 181 and 182 are located on both sides of the center of the first surface 111a below the spine 135.

Accordingly, when the center of the spine 135 is pressed in a process for attaching the pressure clip 100 to the heat source, both bottom surfaces of the spine 135 are supported by the first and second supporting protrusions 181 and 182. In other words, when the spine 135 is pressed, the distance between the first and second mounting parts 141 and 142 becomes wider from both walls of the heat source, and the spine 135 goes downward. Then, when the pressure is released, the first and second hook parts 151 and 152 spring back inward due to a restoring force, and are locked onto and supported by the heat source.

The first and second support ribs 131 and 132 extend from a first side corresponding to a left side of the spine 135, and are affixed to a left part of the first surface 111a of the heat sinking plate 110. The first and second ribs 131 and 132 substantially extend in parallel. Further, the third and fourth ribs 133 and 134 extend from a second side corresponding to a right side of the spine 135, and are affixed to a right part of the first surface 111a of the heat sinking plate 110. The third and fourth ribs 133 and 134 are substantially parallel to each other. Specifically, the first and third ribs 131 and 133 are located on a first line (or, in other words, are aligned), and the second and fourth ribs 132 and 134 are located on a second line (or, in other words, are aligned) substantially parallel with the first line. The first and second lines are substantially orthogonal to the length direction of the spine 135. Accordingly, the first to fourth ribs 131, 132, 133 and 134 are substantially orthogonal to the pressing part 135. The bending space S is formed between the first to fourth ribs 131, 132, 133 and 134 and the first surface 111a of the heat sinking plate 110. Alternatively, ribs can be staggered instead of being aligned and/or can extend obliquely instead of perpendicularly from the spine 135.

Referring to FIGS. 5 and 6, the first and second mounting parts 141 and 142 vertically and downwardly extend from both ends of the spine 135. Specifically, the first and second mounting parts 141 and 142 extend downwardly along two opposite sides of the heat sinking plate 110, and extend beyond the second surface 111b of the heat sinking plate 110. In order to prevent the first and second mounting parts 141 and 142 from moving freely, the first and second mounting parts 141 and 142 are locked onto the locking grooves 114 of the heat sinking plate 110, and adhere closely to an inner wall of the locking grooves 114. Further, first and second locking projections 171 and 172, which are locked onto and supported by the second surface 111b of the heat sinking plate 110, are formed on the inner sides of the first and second mounting parts 141 and 142.

The first and second hook parts 151 and 152 are formed on respective lower ends of the first and second mounting parts 141 and 142. The first and second hook parts 151 and 152 are inserted into locking grooves (not shown) of the heat source, locked onto and supported by the heat source. Thus, the heat spreader 100, using the first and second hook parts 151 and 152, may be assembled with the heat source with a one-touch method (discussed below).

The first and second hook parts 151 and 152 form an acute angle with respect to the length direction of the first and second mounting parts 141 and 142. Here, for example, the first and second hook parts 151 and 152 have a beveled or chamfered shape that is oriented toward the center of the heat sinking plate 110. On the other hand, the bevel or chamfer and the shape of the first and second hook parts 151 and 152 may be changed according to shapes of the locking grooves of the heat source.

The first to fourth ribs 131, 132, 133 and 134 in FIG. 5 form an angle α with respect to the first surface 111a of the heat sinking plate 110. The angle α is controlled by controlling the lengths of the first and second mounting parts 141 and 142. For example, when the lengths of the first and second mounting parts 141 and 142 become shortened, the first and second hook parts 151, 152 of the first and second mounting parts 141 and 142 are inserted into the locking groove of the heat source and the angle α is decreased, so that the tension levels of the spine 135 and the first to fourth ribs 131, 132, 133 and 134 are increased. Accordingly, the interval Ta between the spine 135 and the heat sinking plate 110 may be decreased.

Additionally, in order to more efficiently transmit the heat of the heat source to the heat sinking plate 110, a thermally conductive layer 160 may be interposed between the second surface 111b of the heat sinking plate 110 and the heat source. The presence of the thermally conductive layer 160 can be described as putting the heat sinking plate into indirect, as opposed to direct, thermal contact with the heat source). For example, the thermally conductive layer 160 may be made of a thermally conductive material such as copper or a thermal gap pad.

In FIG. 6, the first and second hook parts 151 and 152 of the pressure clip 100 may be locked onto and supported by the heat source by simply pressing the spine 135, so that the first and second hook parts 151 and 152 of the pressure clip 100 may be inserted into the locking groove of the heat source. Accordingly, the heat spreader may be simply attached to the heat source with a one-touch method (discussed below).

Figure 7:
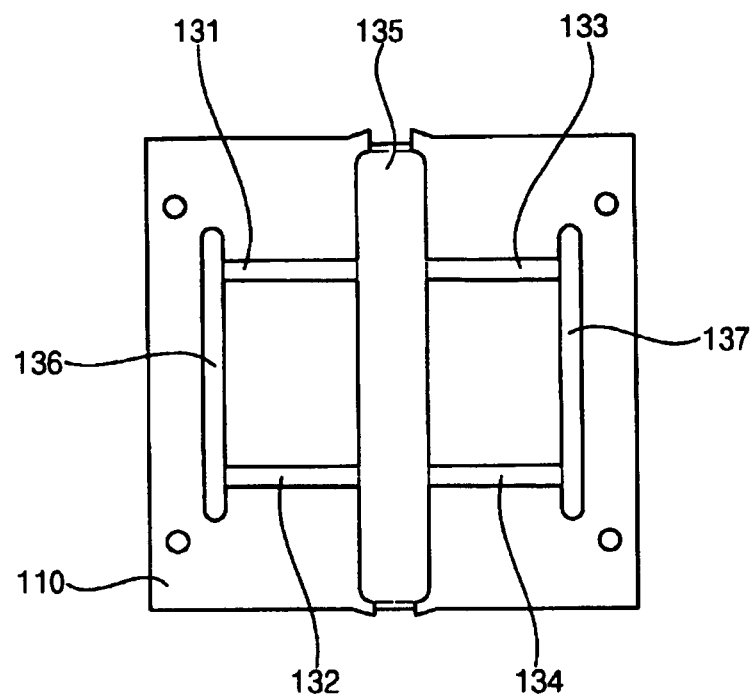
FIG. 7 is a top plan view illustrating a heat spreader according to another example embodiment of the present invention.

FIG. 7 is a top plan view illustrating a heat spreader 100a according to another example embodiment of the present invention.

A heat spreader 100a, except for the rib, may substantially include the same constituent elements as those of the heat spreader 100. Accordingly, the same reference numerals are used for the same elements among/across the figures, and thus any further repeated explanation will be omitted.

Referring to FIG. 7, a first auxiliary contacting member 136 is coupled between lower ends of the first and second ribs 131 and 132, and contact the first surface 110a of the heat sinking plate 100. A second auxiliary contacting member 137 is coupled between lower ends of the third and fourth ribs 133 and 134, and contacts the first surface 110a of the heat sinking plate 110. One part of the first and second auxiliary contacting members 136 and 137 are coupled with the lower ends of the first and the second ribs 131 and 132, and contact the first surface 110a of the heat sinking plate 110. Also, the other part of the first and second auxiliary contacting members 136 and 137 may form the bending space by being spaced with the first surface 111a of the heat sinking plate 110.

Accordingly, the first and second auxiliary contacting members 136 and 137 are substantially parallel with the length direction of the spine 135. The first and second auxiliary contacting members 136 and 137 may support the spine 135 more strongly.

Figure 8:
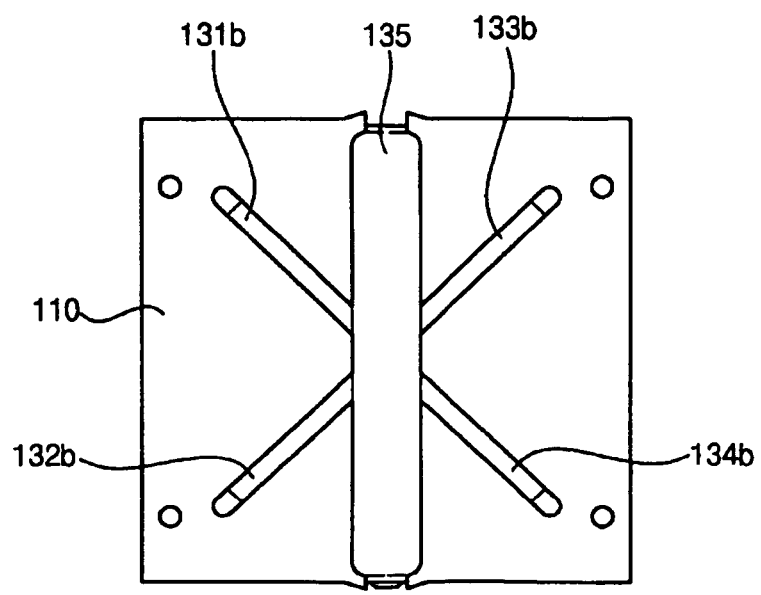
FIG. 8 is a top plan view illustrating a heat spreader according to still another example embodiment of the present invention.

FIG. 8 is a top plan view illustrating a heat spreader 100b according to another example embodiment of the present invention.

A heat spreader 100b, except for the rib, may substantially include the same constituent elements as those of the heat spreader 100. Accordingly, the same reference numerals are used for the same elements among/across the figures, and thus any further repeated explanation will be omitted.

Referring to FIG. 8, first and fourth ribs 131b and 134b are located in a first inclined line that forms an acute angle with respect to the length direction of the spine 135. A second and third ribs 132b and 133b are located in a second inclined line that forms an acute angle with respect to the length direction of the spine 135. The first inclined line and second inclined line are crossed with each other, and approximately take a shape of a cross. In other words, the first and fourth ribs 131b and 134b, and the second and third ribs 132b and 133b are crossed with each other in the shape of the cross. Alternatively, instead of aligning, ribs 131b & 134b as well as 132b & 133b can be staggered.

Figure 9:
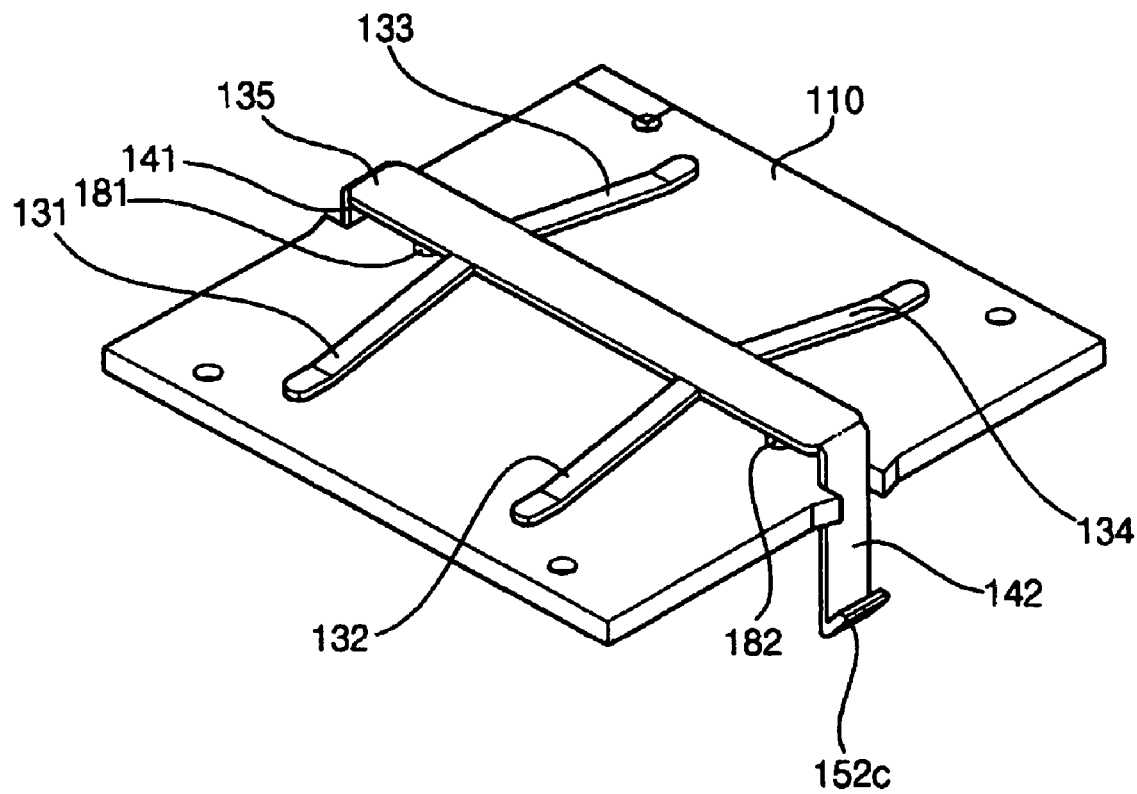
FIG. 9 is a perspective view illustrating a heat spreader according to still another example embodiment of the present invention.

FIG. 9 is a perspective view illustrating a heat spreader 100c according to still another example embodiment of the present invention.

A heat spreader 100c, except for the hook parts, may substantially include the same constituent elements as those of the heat spreader 100. Accordingly, the same reference numerals are used for the same elements among/across the figures, and thus any further repeated explanation will be omitted.

Referring to FIG. 9, a first hook part (not shown) and a second hook part 152c have a shape that is oriented away from the center of the heat sinking plate 110, namely, the outer portion of the heat sinking plate 110. The first hook part and the second hook part 152c in FIG. 9 form an acute angle with respect to the first and second mounting parts 141 and 142. The shape of the first hook part and the second hook part 152c in FIG. 9 is the same as those in FIG. 2.

Figure 10:
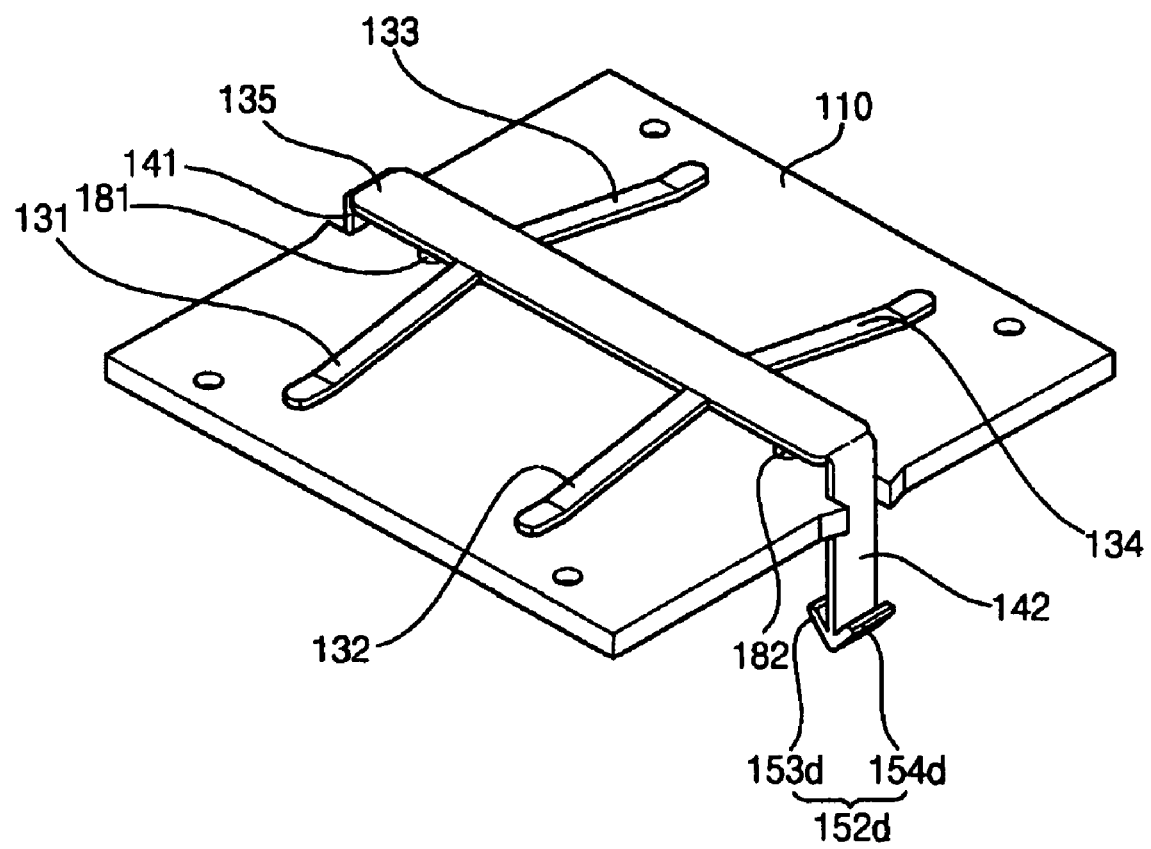
FIG. 10 is a perspective view illustrating a heat spreader according to still another example embodiment of the present invention.

FIG. 10 is a perspective view illustrating a heat spreader 100d according to still another example embodiment of the present invention.

A heat spreader 100d, except for the hook parts, may substantially include the same constituent elements as those of the heat spreader 100. Accordingly, the same reference numerals are used for the same elements among/across the figures, and thus any further repeated explanation will be omitted.

Referring to FIG. 10, a first hook part (not shown) and a second hook part 152d may respectively include an inwardly oriented part 153d that is oriented toward the center of the heat sinking plate 110, and an outwardly oriented part 154d that is oriented toward the outer portion of the heat sinking plate 110. In other words, the first (not shown) and second hook parts 152d have the shape of which the hook parts of FIGS. 3 and 9 are merged.

In FIG. 10, since inwardly and outwardly oriented parts 153d and 154d are supported by the heat source, the heat spreader 100 may be more strongly fixed to the heat source.

Figure 11:
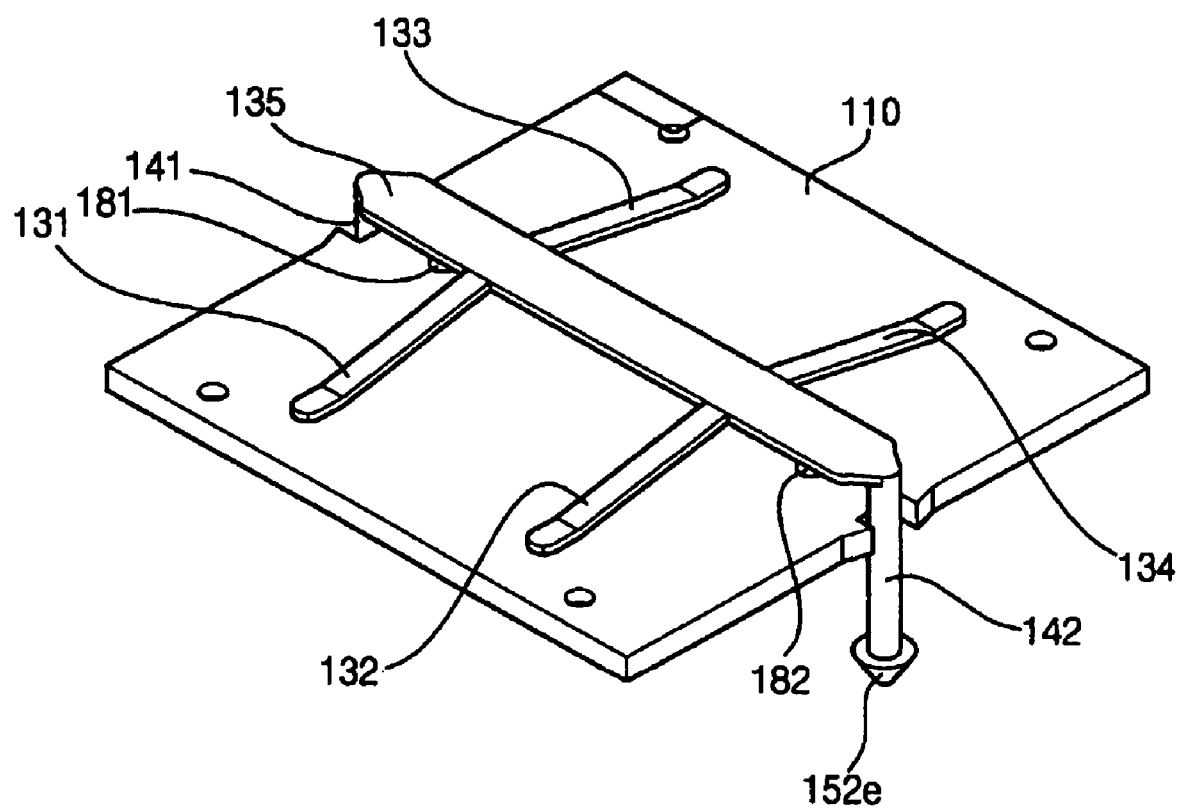
FIG. 11 is a perspective view illustrating a heat spreader according to still another example embodiment of the present invention.

FIG. 11 is a perspective view illustrating a heat spreader 100e according to still another example embodiment of the present invention.

A heat spreader 100e, except for the hook parts, may substantially include the same constituent elements as those of the heat spreader 100. Accordingly, the same reference numerals are used for the same elements among/across the figures, and thus any further repeated explanation will be omitted.

Referring to FIG. 11, a first hook part (not shown) and a second hook part 152e have a cone shape. The first (not shown) and second hook parts 152e having the cone shape may be usefully applied to a case where a locking groove of the heat source has a circular shape. In other words, in case that the locking groove of the heat source has a shape of circle, flat upper surfaces of the first (not shown) and second hook parts 152e, having the cone shape, which are inserted through the circle shape of the locking groove, may fully lock onto and be supported by the heat source.

Semiconductor Package Module

Figure 12:
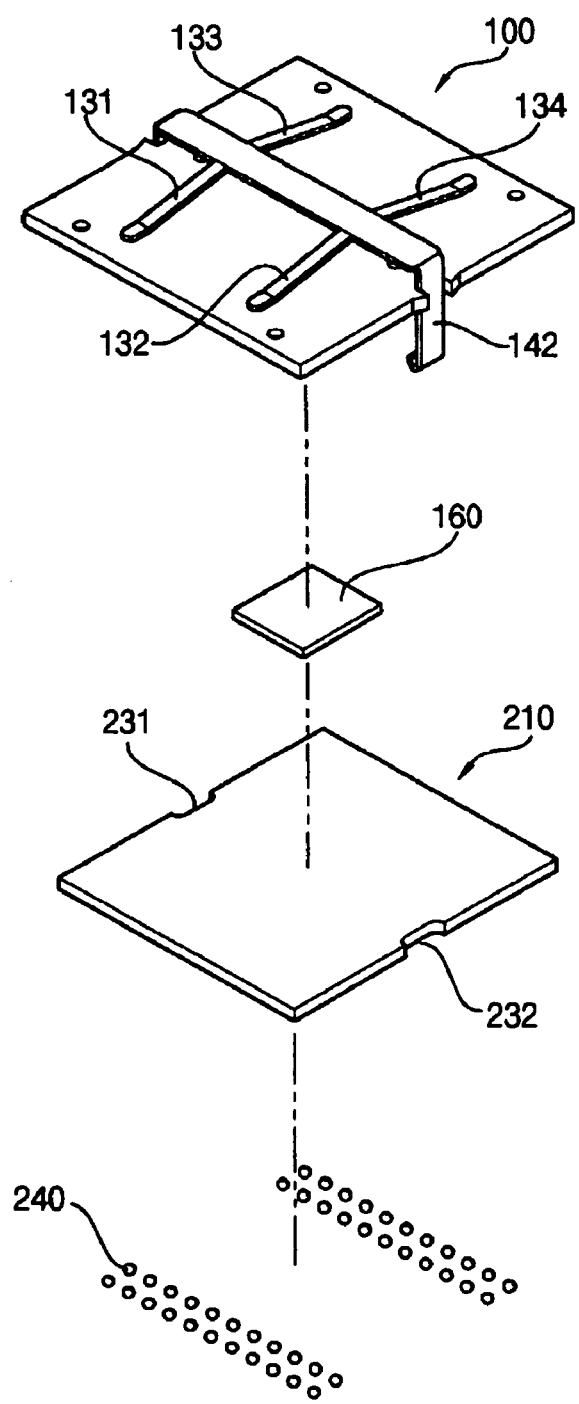
FIG. 12 is an exploded perspective view illustrating a heat spreader according still another example embodiment of the present invention.
Figure 13:
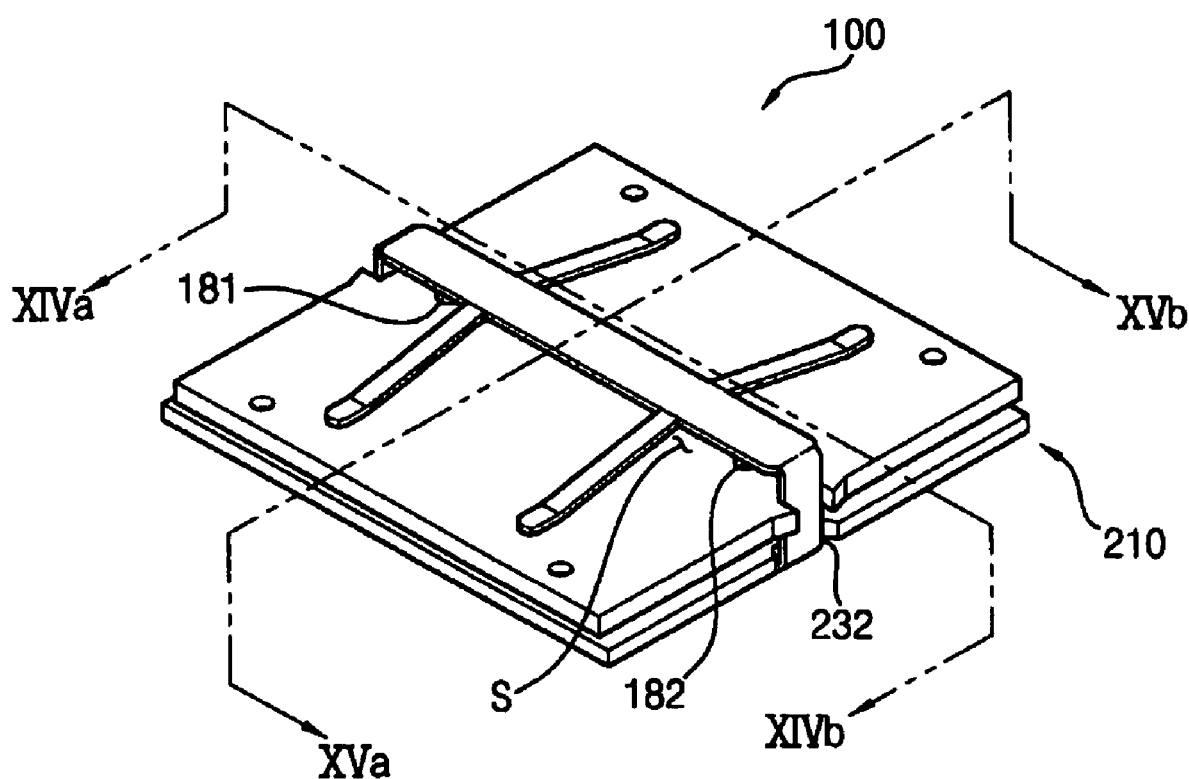
FIG. 13 is an unexploded perspective view illustrating a semiconductor package module shown in FIG. 11 assembled with a heat spreader.
Figure 14:
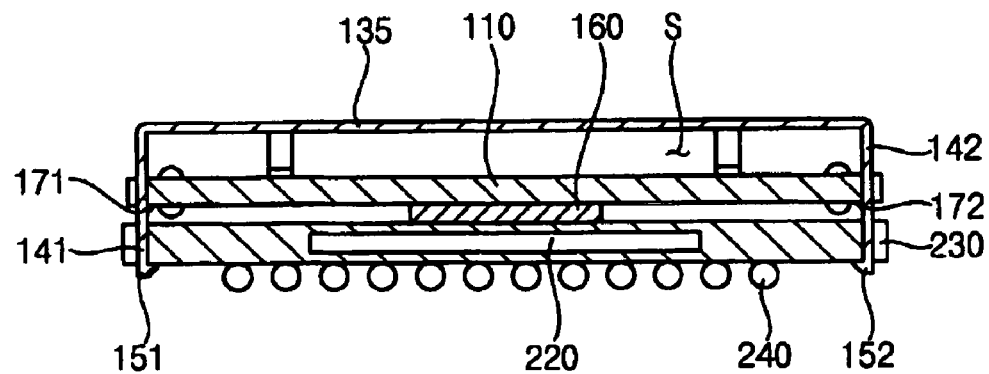
FIG. 14 is a cross-sectional view taken along the line XIVa-XIVb shown in FIG. 13.
Figure 15:
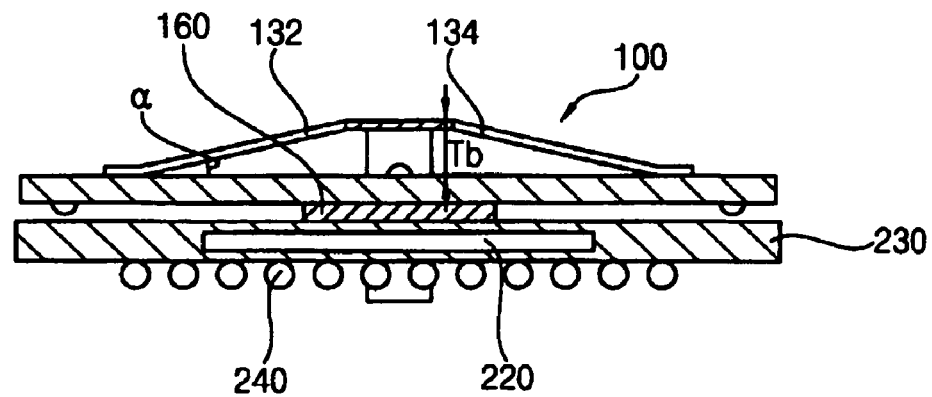
FIG. 15 is a cross-sectional view taken along the line XVa-XVb shown in FIG. 13.

FIG. 12 is an exploded perspective view illustrating a heat spreader 200 according still another example embodiment of the present invention. FIG. 13 is an unexploded perspective view illustrating a semiconductor package module shown in FIG. 11 assembled with a heat spreader. FIG. 14 is a cross-sectional view taken along the line XIVa-XIVb shown in FIG. 13. Additionally, FIG. 15 is a cross-sectional view taken along the line XVa-XVb shown in FIG. 13.

Referring to FIGS. 12 to 15, a semiconductor package module 200 may include a semiconductor package 210 and the heat spreader 100 for radiating heat generated from the semiconductor package 210.

The heat spreader 100 may be attached to the surface of the semiconductor package 210 via a thermally conductive layer 160. Since the heat spreader 100 has been explained in detail, a repeated explanation will be omitted. Meanwhile, the heat spreaders discussed above including the heat spreader 100 may be applied to the semiconductor package module 200.

The semiconductor package module 210 may include a semiconductor chip 220 (shown in FIG. 14), a mold 230 for surrounding the semiconductor chip 220 and conductive bumps (e.g., solder balls) 240 electrically coupled to the semiconductor chip 220 and arranged on a bottom surface of the mold 230. The mold 230 contacts the heat sinking plate 110 of the heat spreader 100 via the thermally conductive layer 160.

The semiconductor package 210 is a, e.g., ball grid array (BGA) package. Other types of packages, for example, a chip-scale package (CSP), a wafer-level package (WLP) or the like may also be used.

First and second locking grooves 231 and 232 are formed on both sides of the mold 230. The first and second mounting parts 141 and 142 of the heat spreader 100 are inserted into the first and second locking grooves 231 and 232, and the first and second hook parts 151 and 152 are locked onto and supported by the bottom surface of the mold 230. On the other hand, the first locking groove 231 is formed in one side of the mold 230, and the second locking groove 232 may be penetrated and formed into a part adjacent to the other side of the mold 230.

In other words, when the center of the spine 135 is pressed in a state in which the heat spreader 100 is arranged on the surface of the mold 230, the spine 135 is deflected into a bending space S. In this time, first and second supporting protrusion parts 181 and 182 support the spine 135, and the first and second mounting parts 141 and 142 are inserted into the first and the second locking grooves 231 and 232 in a state in which the distance between the first and second mounting parts 141 and 142 are wider toward both sides. Additionally, when an external force pressing the spine 135 is removed, the first and second hook parts 151 and 152 are strongly locked and supported by the bottom surface of the mold 230 while the first and second hook parts 151 and 152 are returned to the original position due to an elastic force.

The first, second, third and fourth ribs 131, 132, 133 and 134 of FIG. 15 form an angle α with respect to the first surface 111a of the heat sinking plate 110. The angle α is controlled by controlling the lengths of the first and second mounting parts 141 and 142. For example, in case that the lengths of the first and second mounting parts 141 and 142 are shortened, the first and second hook parts 151 and 152 of the first and second mounting parts 141 and 142 are inserted into the locking grooves 231 and 232 of the semiconductor package 210 and the angle of α is decreased, so that the tension levels of the spine 135 and the first to fourth ribs 131, 132, 133 and 134 may be increased. Consequently, an interval Tb between the spine 135 and the heat sinking plate 100 may be decreased.

The heat spreader 100 may be easily attached to the semiconductor package 210 with a one-touch method in which the spine 135 is pressed once, e.g., by a user. In such a one-touch method according to an example embodiment of the present invention, the heat spreader 100 is oriented over an upper surface of the semiconductor package 210 as in, e.g., FIG. 12 albeit with the first and second hook parts (151 and 152, see FIG. 2) just beginning to making contact with edges of the corresponding locking grooves 231 and 232 of the semiconductor package 210. A force is applied to the spine 135, e.g., in the central region, to press the heat spreader 100 towards the semiconductor package 210.

Initially, the beveled configuration of the hook parts causes them and mounting parts (141 and 142, see FIG. 2) to be deflected outward as the heat spreader 100 is moved closer towards the semiconductor package. Next, the hook parts abut sidewalls of the semiconductor package 210 as the heat spreader is moved yet closer toward the semiconductor package 210. After the heat spreader 100 has moved a sufficient distance toward the semiconductor package 210, the hook parts no longer abut the sidewalls and so then resiliently snap back. Hence, the hook parts and mounting parts are no longer (or not nearly so significantly) displaced outwardly such that the hook parts become supported by a lower surface of the semiconductor package 210. In other words, the one-touch method (in effect) causes the hook parts and mounting parts to function as arms that are caused to deflectably embrace the semiconductor package 210.

Memory Module

Figure 16:
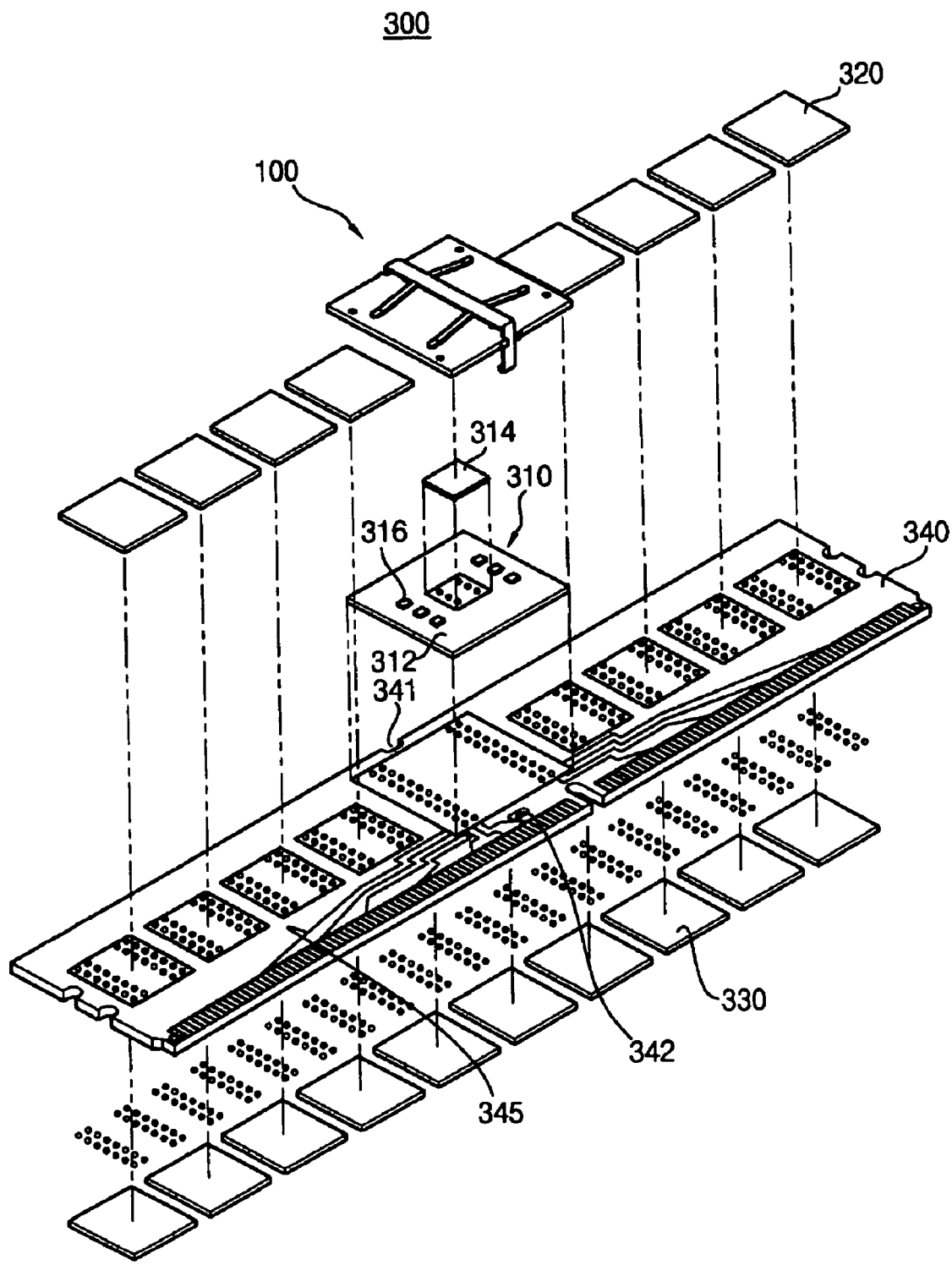
FIG. 16 is an exploded perspective view illustrating a memory module according to still another example embodiment of the present invention.
Figure 17:
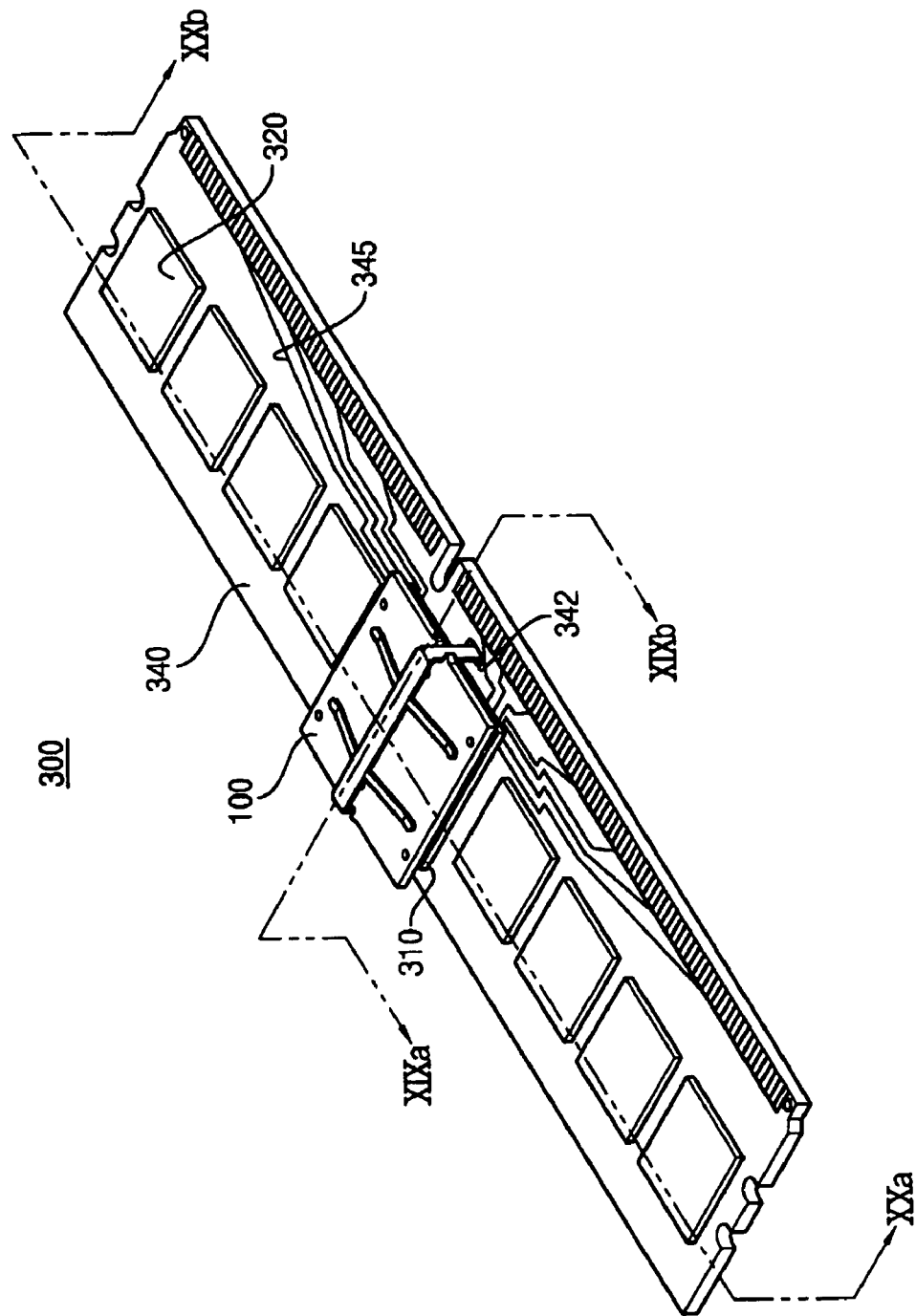
FIG. 17 is an unexploded perspective view illustrating a state in which the memory module shown in FIG. 16 is completely assembled.
Figure 18:
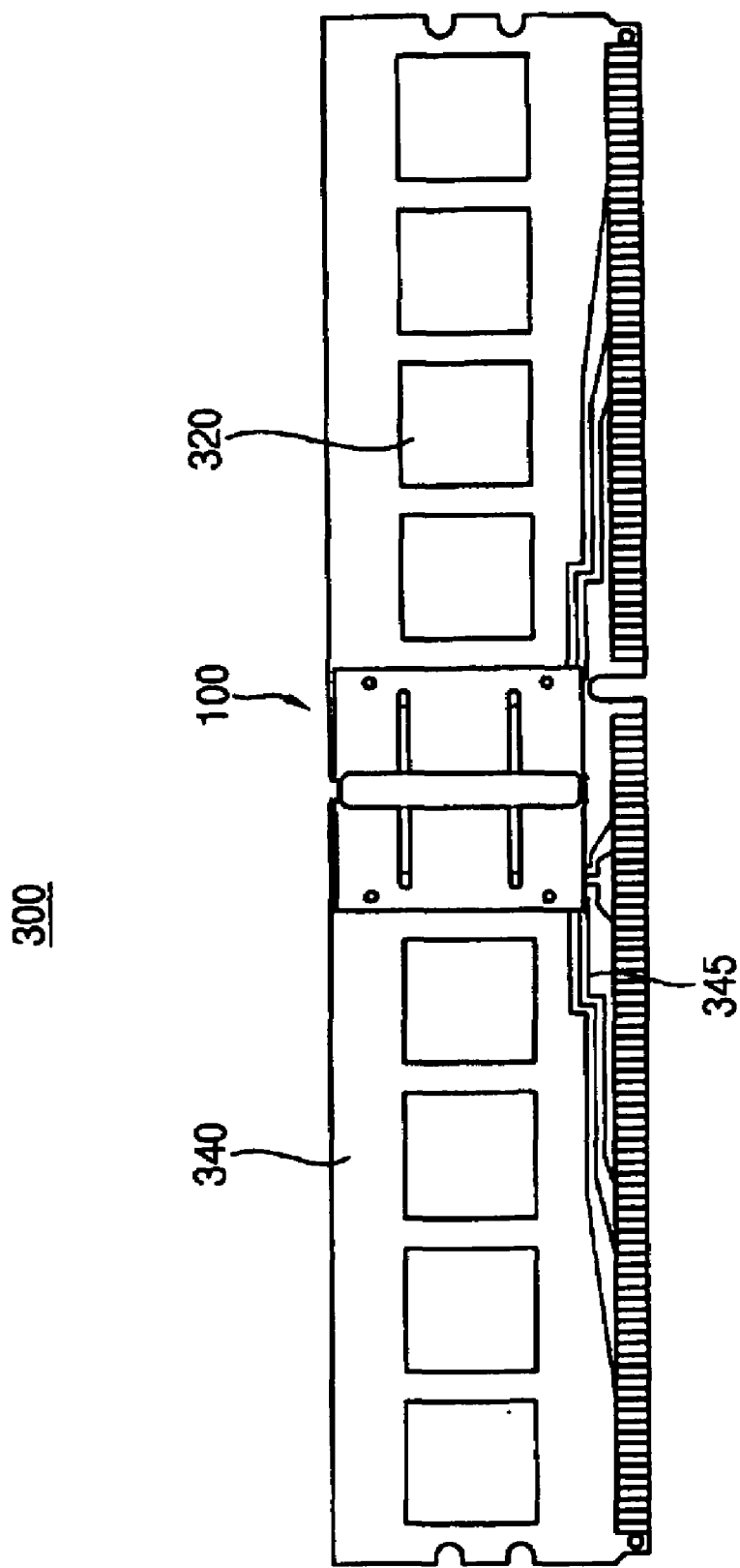
FIG. 18 is a top plan view illustrating the memory module shown in FIG. 17.
Figure 19:
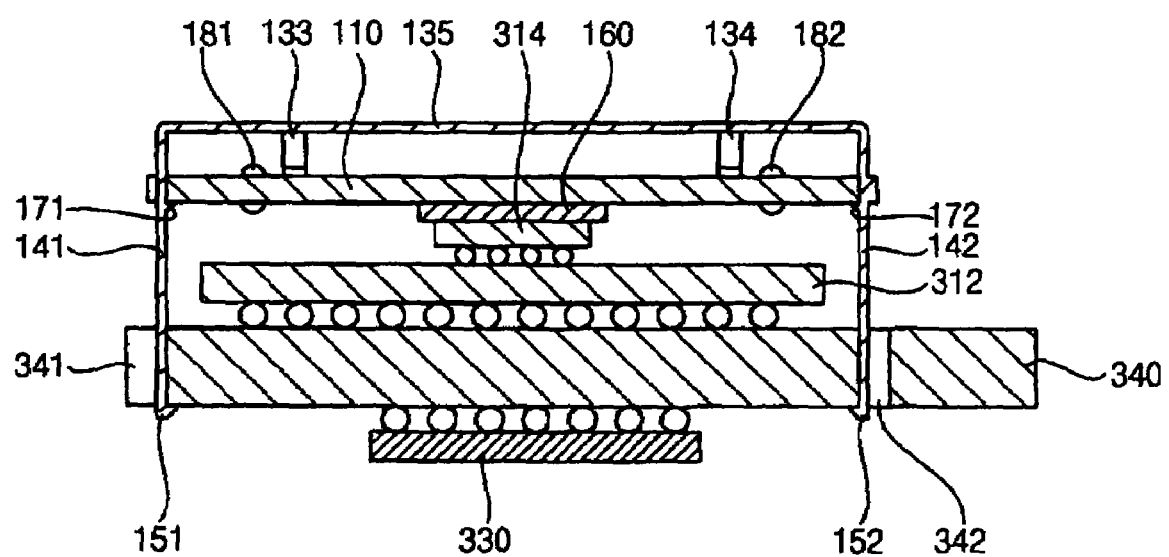
FIG. 19 is a cross-sectional view taken along the line XIXa-XIXb shown in FIG. 17.
Figure 20:
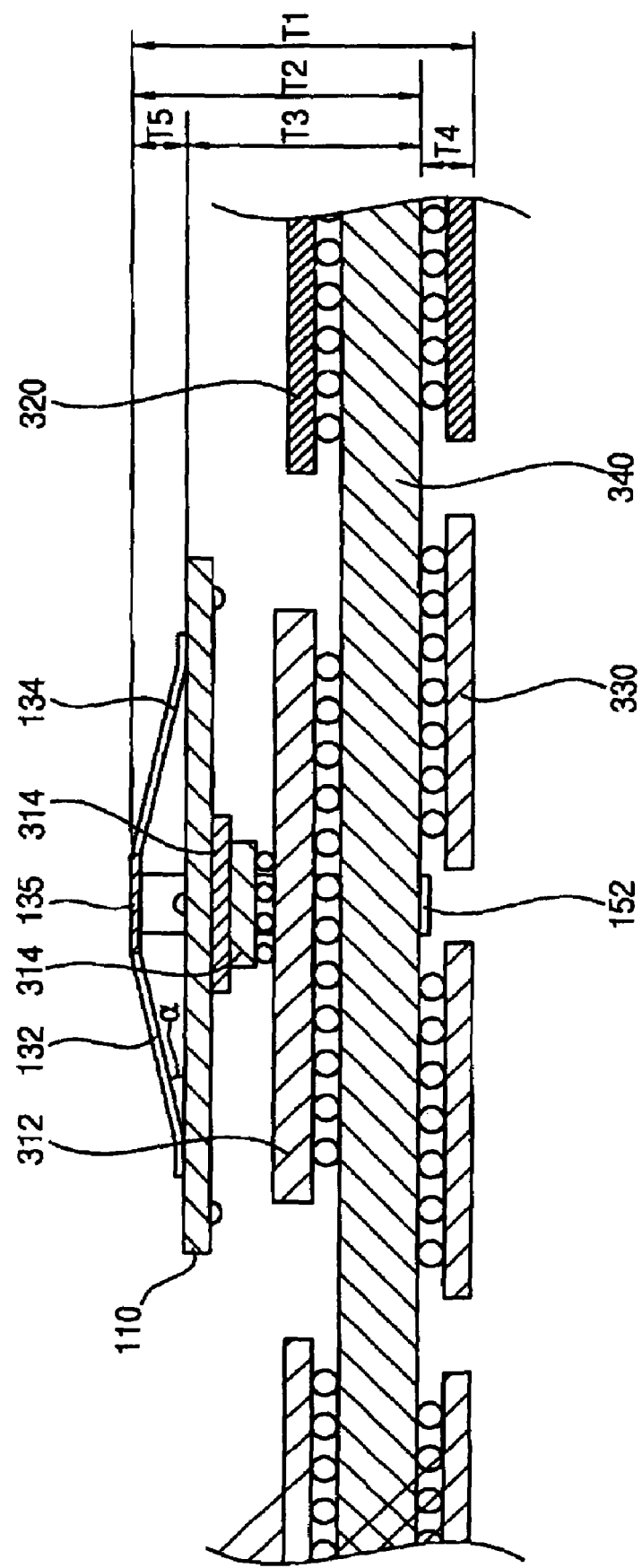
FIG. 20 is a cross-sectional view taken along the line XXa-XXb shown in FIG. 17.

FIG. 16 is an exploded perspective view illustrating a memory module 300 according to still another example embodiment of the present invention. FIG. 17 is an unexploded perspective view illustrating a state in which the memory module shown in FIG. 16 is completely assembled. FIG. 18 is a top plan view illustrating the memory module shown in FIG. 17. FIG. 19 is a cross-sectional view taken along the line XIXa-XIXb shown in FIG. 17. FIG. 20 is a cross-sectional view taken along the line XXa-XXb shown in FIG. 17.

Referring FIGS. 16 to 20, a memory module 300 may include a PCB 340, an AMB package 310 that is mounted on the center of a first surface of the PCB 340, a plurality of first semiconductor packages 320 that is mounted on both sides of the first surface of the PCB 340, a plurality of second semiconductor packages 330 that is mounted on a second surface of the PCB 340 opposite to the first surface, and the heat spreader 100 that is installed on the AMB package 310 of the PCB 340 and radiates the heat of the AMB package 310.

Since the heat spreader 100 has been explained in detail, a repeated explanation will be omitted. Meanwhile, the heat spreaders 100a, 100b, 100c, 100d and 100e discussed above and including the heat spreader 100 may be applied to the memory module 300.

Furthermore, since the first and second semiconductor packages 320 and 330, except for the locking groove, are substantially composed of the same constituent elements as those of the semiconductor package 200, explanations of the first and second semiconductor packages 320 and 330 will be omitted.

The AMB package 310 may include an AMB substrate 312 mounted on a first surface of the PCB 340 via conductive bumps (e.g., solder balls), an AMB chip 314 mounted on the center of the surface of the AMB substrate 312 via the solder balls, and a passive element semiconductor chip 316 mounted on both sides of the first surface of the AMB substrate 312. The passive element semiconductor chip 316 may be a semiconductor chip that functions as a passive element such as a resistor or a capacitor, etc. The AMB chip 314 contacts the heat sinking plate 110 of the heat spreader 100 via the thermally conductive layer 160. The AMB chip 314 functions as a hub between the memory controller (not shown) and respective memory chips. A plurality of external signal lines 345 formed on the first surface of the PCB 340 is coupled to the AMB chip 314. The AMB chip 314 transmits memory commands and data that are provided from a host (for example, a memory controller) through the external signal line 345 selectively to a memory chip in respective semiconductor packages 320 and 330, packetizes the data outputted from the plurality of memory chips, and transmits the packets to the host.

The PCB 340 has first and second locking grooves 341 and 342. The first locking groove 341 is formed at one side of the PCB 340. The second locking groove 342 is penetrated into a portion adjacent to the other side of the PCB 340. The first and second mounting parts 141 and 142 of the heat spreader 100 are inserted into the first and second locking grooves 341 and 342, and the first and second hook parts 151 and 152 are locked onto and supported by the second surface of the PCB 340. The first and the second locking grooves 341 and 342 may be formed at both sides of the PCB 340, or alternatively, may be penetrated into the PCB 340.

When the center of the spine 135 is pressed in a state in which the first and second hook parts 151 and 152 of the heat spreader 100 are located on the surface of the AMB package 310 corresponding to the first and second locking grooves 341 and 342, the spine 135 is pressed into the bending space S. In this case, the first and second supporting protrusion parts 181 and 182 support the spine 135, and the first and second mounting parts 141 and 142 are inserted into the first and second locking grooves 341 and 342, in a state in which the distance between the first and second mounting parts 141 and 142 are wider toward both sides. Additionally, when an external force pressing the spine 135 is removed, the first and second hook parts 151 and 152 are locked onto and supported by the bottom surface of the PCB 340 while the first and second hook parts 151 and 152 are returned to the original position due to an elastic force.

The heat spreader 100 may be easily attached to the PCB 340 with a one-touch method in which the spine 135 is pressed once.

Referring to FIG. 20, the first to fourth ribs 131, 132, 133 and 134 form an angle α with respect to the first surface 111a of the heat sinking plate 110. The angle α is controlled by controlling the length of the first and second mounting parts 141 and 142. For example, when the length of the first and second mounting parts 141 and 142 is shortened, the first and second hook parts 151 and 152 of the first and second mounting parts 141 and 142 are inserted into the locking grooves 341 and 342 of the PCB 340, and thus the angle α is decreased, so that the tension levels of the spine 135 and the first to fourth ribs 131, 132, 133 and 134 are increased. Consequently, an interval T5 between the spine 135 and the heat sinking plate 110 may be decreased.

Alternatively, the heat spreader 100 may be applied to other memory modules, e.g., a SIMM having the structure in which semiconductor packages are mounted on only one surface of the PCB, etc.

Measuring Thickness of Memory Module

Table 1 illustrates results of measuring thicknesses of respective points in a specific (yet non-limiting) sample instantiation of the memory module 300 including the heat spreader 100 according to an example embodiment of the present invention as shown in FIG. 20.

TABLE 1

| | Thickness (mm) | | | |
| --- | --- | --- | --- | --- |
| | T1 | T2 | T3 | T4 |
| JEDEC | 8.20 | 6.80 | 5.20 | 1.40 |
| Present Invention | 7.70 | 6.242 | 4.596 | 1.40 |

In Table 1, the Joint Electron Device Engineering Council (JEDEC) is an organization that establishes international standards for memory modules. All of the manufacturing companies must manufacture memory modules conforming to the international standards that have been established by JEDEC.

T1 represents a thickness measured from the surface of the spine 135 of the heat spreader 100 to the bottom surface of a second package 330. T2 represents a thickness measured from the upper surface of the spine 135 to the bottom surface of the PCB 340. T3 represents a thickness measured from the upper surface of the heat sinking plate 110 to the bottom surface of the PCB 340. T4 represents a thickness of the second package 330, and T5 represents a thickness measured from the upper surface of the spine 315 to the upper surface of the heat sinking plate 110.

In the example embodiments of the present invention, the thickness T2 and T3 may be shortened, e.g., by controlling the length of the mounting parts 141 and 142 of the heat spreader 100 to decrease the thickness T5.

As illustrated in Table 1, the thicknesses T1, T2 and T3 of the memory module 300 are thinner than those established by JEDEC and thus satisfy the international standards of JEDEC.

Measuring Temperature of Memory Module

A temperature was measured along the length direction of the PCB corresponding to the conventional memory module as shown in FIG. 1 and the memory module of the present invention as shown in FIG. 18 and described in Table 1.

Figure 21:
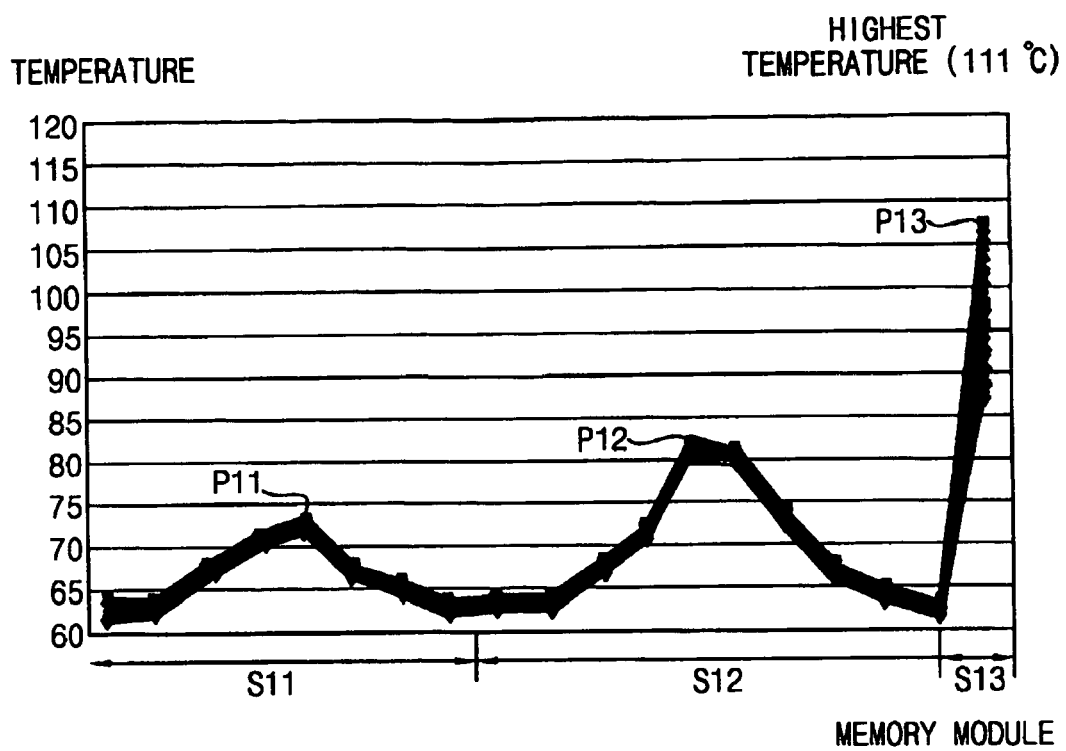
FIG. 21 is a graph illustrating a waveform of temperatures measured at respective points of a specific (yet non-limiting) sample instantiation of the memory module shown in FIG. 1.

FIG. 21 is a graph illustrating temperatures measured at respective points of the specific (yet non-limiting) sample instantiation of the memory module along the length direction of the PCB shown in FIG. 1 in a state in which the heat spreader 3 is mounted on the PCB 1.

Referring to FIG. 21, section S11 represents results of measuring temperatures of respective points of the memory module along the first surface of the memory module in which the heat spreader 3 is arranged, and section S12 represents results of measuring temperatures of respective points of the memory module along the bottom surface of the memory module opposite to the first surface. Further, section S13 represents a temperature measured at the AMB. Specifically, a point P11 represents a temperature measured at the PCB 1 in a position corresponding to the AMB disposed on the first surface of the memory module, and a point P12 represents a temperature measured at the PCB 1 in a position corresponding to the AMB disposed on the opposite surface of the first surface of the memory module. Additionally, point P13 represents a temperature directly measured at the AMB on the first surface of the memory module.

As illustrated in FIG. 21, the temperatures of points P11, P12, and P13 at which the AMB is located, are higher than that of other points. Specifically, the highest temperature measured directly at the AMB (point P13) is about 111° C.

Figure 22:
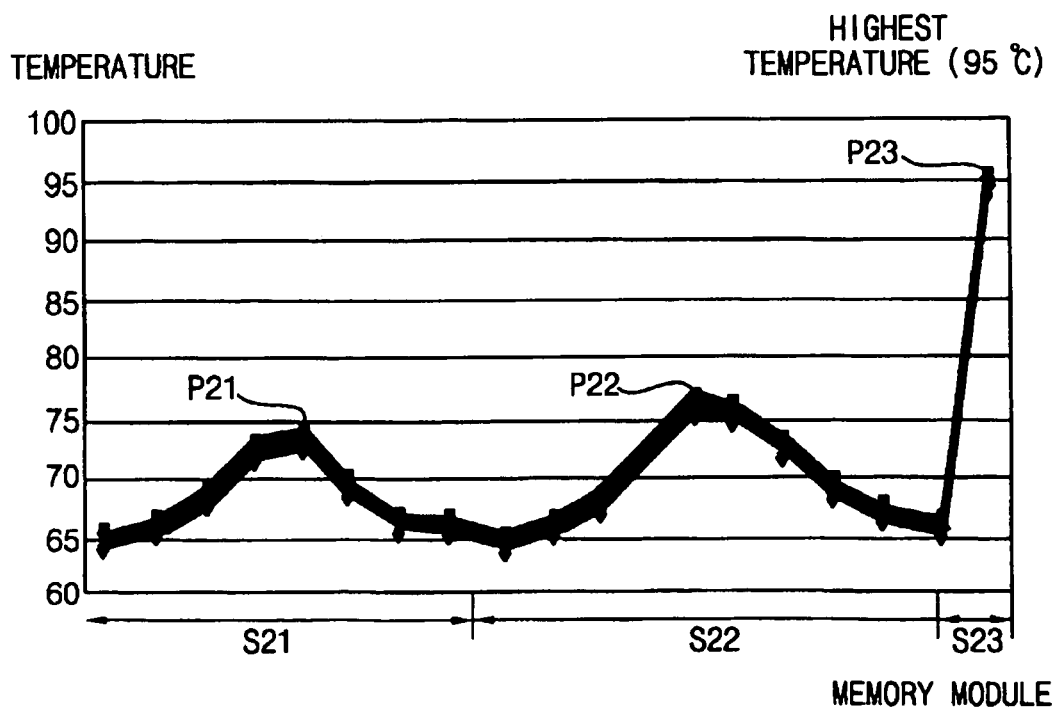
FIG. 22 is a graph illustrating a waveform of temperatures measured at respective points, which are on the line XXa-XXb of the specific (yet non-limiting) sample instantiation of the memory module shown in FIG. 17.

FIG. 22 is a graph illustrating a waveform of temperatures measured at respective points, which are on the line XXa-XXb shown in FIG. 17 on the specific (yet non-limiting)

sample instantiation of the memory module in a state in which the heat spreader 100 is mounted on the PCB 340. In FIG. 22, section S21 represents results of measuring temperatures of respective points of the memory module along the first surface of the memory module in which the heat spreader 100 is arranged, and section S22 represents results of measuring the temperatures of respective points of the memory module along the bottom surface of the memory module opposite to the first surface of the memory module. Further, section S23 represents a temperature measured directly at the AMB 310. Specifically, point P21 represents a temperature measured at the PCB 340 in a position corresponding to the AMB 310 disposed on the first surface of the memory module, and point P22 represents a temperature measured at the PCB in a position corresponding to the AMB 310 disposed on the opposite surface of the first surface of the memory module. Additionally, point P13 represents a temperature directly measured at the AMB 310 disposed on the first surface of the memory module.

As shown in FIG. 22, the temperatures of points P11, P12 and P13 at which the AMB is located are higher than that of other points. Specifically, the highest temperature measured directly at the AMB is 95° C., which is lower than the highest temperature of 111° C. of the conventional memory module by 16° C.

As described above, a heat spreader according to one or more embodiments of the present invention has advanced characteristics of heat radiation in comparison with the conventional heat spreader. In addition, such a heat spreader has the advanced characteristics of heat radiation, thereby being capable of radiating the high-temperature heat generated from a hub, e.g., an AMB, at which many signal lines of a memory module, e.g., a FBDIMM memory module, are concentrated. Furthermore, such a heat spreader has a relatively thin thickness, thereby being capable of satisfying the international standards of JEDEC.

According to one or more embodiments of the present invention, the heat spreader may be attached to the PCB with a one-touch method. Accordingly, assembling processes of the memory module may be automated.

With some embodiments of the present invention having thus been described, it will be obvious that the same may be varied in many ways. Such variations are not to be regarded as a departure from the spirit and scope of the present invention, and all such modifications are intended to be included within the scope of the present invention.

What is claimed is:

1. A heat spreader comprising:
a heat sinking plate configured to radiate heat away from a heat source; and
a pressure clip including the following,
a spine arranged on the heat sinking plate,
hook parts that extend from both ends of the spine to engage the heat source, and
one or more ribs that extend from sides of the spine and contact the spine, and not the heat sinking plate, at one end of the rib and a top surface of the heat sinking plate at the other end of the rib.

2. The heat spreader of claim 1, wherein the spine is spaced apart from the heat sinking plate so that a bending space is formed between the spine and the heat sinking plate.

3. The heat spreader of claim 1, wherein the hook part is oriented toward the center of the heat sinking plate.

4. The heat spreader of claim 1, wherein the hook part is oriented away from an outer portion of the heat sinking plate.

5. The heat spreader of claim 1, wherein the hook part includes inwardly and outwardly oriented parts that are respectively oriented toward the center and the outer portion of the heat sinking plate.

6. The heat spreader of claim 1, wherein the hook parts have a cone shape, respectively.

7. The heat spreader of claim 1, wherein the pressure clip includes an elastically deformable material.

8. The heat spreader of claim 7, wherein the pressure clip includes copper.

9. The heat spreader of claim 7, wherein the pressure clip further includes a mounting part configured to couple the spine with the hook part.

10. The heat spreader of claim 9, wherein a locking groove configured to the mounting part is formed on a side of the heat sinking plate.

11. The heat spreader of claim 9, wherein the mounting part has a locking projection that is engaged by and supported by the heat sinking plate.

12. The heat spreader of claim 9, wherein an interval between the spine and the heat sinking plate is controlled by varying a length of the mounting part so as to control a height of a bending space, the bending space being formed between the spine and the heat sinking plate.

13. The heat spreader of claim 1, wherein the heat sinking plate has at least one supporting protrusion part that supports the spine.

14. The heat spreader of claim 13, wherein the heat sinking plate includes first and second protrusion parts that are arranged along a length direction of the spine and are spaced apart from each other.

15. The heat spreader of claim 1, wherein the heat sinking plate has convex parts.

16. The heat spreader of claim 15, wherein the convex parts are formed on a surface of the heat sinking plate located in a position opposite to the heat source.

17. The heat spreader of claim 1, wherein the heat sinking plate includes copper.

18. The heat spreader of claim 1, further comprising a thermally conductive layer disposed between the heat sinking plate and the heat source.

19. A heat spreader comprising:
a heat sinking plate configured to radiate heat away from a heat source; and
a pressure clip including the following,
a spine arranged on the heat sinking plate,
hook parts that extend from both ends of the spine to engage the heat source, and
one or more ribs that extend from sides of the spine and contact the heat sinking plate, wherein the one or more ribs include:
a first rib that extends from a first surface of the spine and contacts the heat sinking plate;
a second rib that extends from the first side of the spine, is spaced apart by a first distance from the first rib, and contacts the heat sinking plate;
a third rib that extends from a second side of the spine; and
a fourth rib that extends from the second side of the spine, is spaced apart by a second distance from the third rib, and contacts the heat sinking plate.

20. The heat spreader of claim 19, wherein the first and third ribs are located on a first line, and the second and fourth ribs are located on a second line different from the first line.

21. The heat spreader of claim 20, wherein the first and second lines are substantially parallel.

22. The heat spreader of claim 20, wherein the first line crosses the second line.

23. A heat spreader comprising:
a heat sinking plate configured to radiate heat away from a heat source; and
a pressure clip including the following:
a spine arranged on the heat sinking plate,
hook parts that extend from the spine to engage the heat source, and
one or more ribs that extend from the spine and contact the heat sinking plate, wherein the one or more ribs include:
a first rib that extends from a first surface of the spine and contacts the heat sinking plate;
a second rib that extends from the first side of the spine, is spaced apart by a first distance from the first rib, and contacts the heat sinking plate;
a third rib that extends from a second side of the spine; and
a fourth rib that extends from the second side of the spine, is spaced apart by a second distance from the third rib, and contacts the heat sinking plate,
wherein the one or more ribs further comprises:
a first auxiliary contacting member coupled between the first and second ribs, and configured to be fixed to the heat sinking plate; and
a second auxiliary contacting member coupled between the third and fourth ribs, and configured to be fixed to the heat sinking plate.

24. A heat spreader coupled to a heat source, the heat spreader comprising:
a heat sinking plate having locking grooves and configured to radiate heat away from the heat source; and
a pressure clip made of an elastically deformable material, and configured to form a bending space between the pressure clip and the heat sinking plate,
wherein, the pressure clip engages the heat sinking plate at the locking grooves and on a top surface of the heat sinking plate with one or more ribs.

25. The heat spreader of claim 24, wherein the pressure clip comprises:
a spine spaced apart from the heat sinking plate to form the bending space wherein the one or more ribs extend from sides of the spine and contact the heat sinking plate;
mounting parts that extend from the spine toward the heat source; and
hook parts formed in the mounting parts, and configured to be supported by the heat source.

26. The heat spreader of claim 25, wherein the one or more ribs include:
a first rib that extends from a first side of the spine and contacts the heat sinking plate;
a second rib that extends from the first side of the spine, is spaced apart from the first rib, and contacts the heat sinking plate;
a third rib that extends from a second side of the spine; and
a fourth rib that extends from the second side of the spine, is spaced apart from the third rib, and contacts the heat sinking plate.

27. The heat spreader of claim 25, wherein the mounting parts have a locking projection that is engaged by and supported by the heat sinking plate.

28. The heat spreader of claim 25, wherein the hook parts are oriented toward the center of the heat sinking plate.

29. The heat spreader of claim 24, further comprising a thermally conductive layer disposed between the heat sinking plate and the heat source.

30. The heat spreader of claim 24, wherein the heat sinking plate includes first and second protrusion parts that support the spine, are arranged along a length direction of the pressure clip, and are spaced apart from each other.

31. The heat spreader of claim 24, wherein:
the pressure clip has arms that extend beyond the heat sinking plate; and
the heat spreader is configured to be coupled to the heat source by the arms deflectably embracing the heat source.

32. The heat spreader of claim 24, wherein:
hook parts and portions of mounting parts extend beyond the heat sinking plate; and
the heat spreader is configured to be coupled to the heat source by the hook parts and mounting parts deflectably embracing the heat source.

33. A heat spreader coupled to a heat source, the heat spreader comprising:
a heat sinking plate configured to radiate heat away from the heat source; and
a pressure clip made of an elastically deformable material, and configured to form a bending space between the pressure clip and the heat sinking plate wherein the pressure clip comprises:
a spine spaced apart from the heat sinking plate to form the bending space;
one or more ribs that extend from sides of the spine and contacts the heat sinking plate;
mounting parts that extend from the spine toward the heat source; and
hook parts formed in the mounting parts, and configured to be supported by the heat source, wherein the one or more ribs include:
a first rib that extends from a first side of the spine and contacts the heat sinking plate;
a second rib that extends from the first side of the spine, is spaced apart from the first rib, and contacts the heat sinking plate;
a third rib that extends from a second side of the spine; and
a fourth rib that extends from the second side of the spine, is spaced apart from the third rib, and contacts the heat sinking plate, wherein the one or more ribs further comprises:
a first auxiliary contacting member coupled between the first and second ribs, and configured to contact the heat sinking plate; and
a second auxiliary contacting member coupled between the third and fourth ribs, and configured to contact the heat sinking plate.

34. A heat spreader comprising:
a heat sinking plate having a first surface, a second surface disposed toward a
heat source, and a plurality of sides in which a plurality of locking grooves are formed;
a pressure clip that is coupled to the heat sinking plate so that a bending space is formed between the pressure clip and the first surface of the heat sinking plate; and
a thermally conductive layer disposed between the second surface of the heat sinking plate and the heat source;
wherein the pressure clip comprises;
a spine that is spaced apart from the first surface of the heat sinking plate to form the bending space;
first, second, third and fourth ribs, that extend from sides of the spine and contact the first surface of the heat sinking plate;
first and second mounting parts that extend from ends of the spine toward the heat source and beyond the second surface of the heat sinking plate; and first and second hook parts formed in the first and second mounting parts, and configured to be supported by the heat source.

35. The heat spreader of claim 34, wherein the first and second mounting parts respectively have locking projections that are engaged by and are supported by the second surface of the heat sinking plate.

36. The heat spreader of claim 34, wherein the first and second hook parts are oriented toward the center of the second surface of the heat sinking plate.

37. A heat spreader comprising:
- a heat sinking plate having a first surface, a second surface disposed toward a
- heat source, and a plurality of sides in which a plurality of locking grooves are formed;
- a pressure clip that is coupled to the heat sinking plate so that a bending space is formed between the pressure clip and the first surface of the heat sinking plate; and
- a thermally conductive layer disposed between the second surface of the heat sinking plate and the heat source;

wherein the pressure clip comprises;
- a spine that is spaced apart from the first surface of the heat sinking plate to form the bending space;
- first, second, third and fourth ribs, that extend from sides of the spine and contact the first surface of the heat sinking plate;
- first and second mounting parts that extend toward the heat source and beyond the second surface of the heat sinking plate; and
- first and second hook parts formed in the first and second mounting parts, and configured to be supported by the heat source, wherein the pressure clip further includes;
a first auxiliary contacting member coupled between the first and second ribs, and configured to contact the first surface of the heat sinking plate; and a second auxiliary contacting member coupled between the third and fourth ribs, and configured to contact the first surface of the heat sinking plate.

* * * * *